US009500713B1

United States Patent
Ghantous et al.

(10) Patent No.: US 9,500,713 B1
(45) Date of Patent: Nov. 22, 2016

(54) CIRCUITRY AND TECHNIQUES FOR DETERMINING AN SOC OF A BATTERY/CELL HAVING A SILICON-BASED ANODE AND A FUEL GAUGE THEREFOR

(71) Applicant: Qnovo Inc., Newark, CA (US)

(72) Inventors: Dania Ghantous, Walnut Creek, CA (US); Christina Peabody, Fremont, CA (US); Nadim Maluf, Los Altos, CA (US); Fred Berkowitz, Los Gatos, CA (US); Miroslav Zmrzli, San Francisco, CA (US); David Bruce Koons, Los Gatos, CA (US)

(73) Assignee: Qnovo Inc., Newark, CA (US)

( * ) Notice: Subject to any disclaimer, the term of this patent is extended or adjusted under 35 U.S.C. 154(b) by 305 days.

(21) Appl. No.: 14/195,376

(22) Filed: Mar. 3, 2014

Related U.S. Application Data

(60) Provisional application No. 61/772,891, filed on Mar. 5, 2013.

(51) Int. Cl.
*H02J 7/00* (2006.01)
*G01R 31/36* (2006.01)

(52) U.S. Cl.
CPC .................. *G01R 31/362* (2013.01)

(58) Field of Classification Search
CPC .................................................. G01R 31/362

USPC ......................................................... 320/132
See application file for complete search history.

(56) References Cited

U.S. PATENT DOCUMENTS

| | | |
|---|---|---|
| 5,691,078 A | 11/1997 | Kosaki et al. |
| 5,949,217 A | 9/1999 | Okada et al. |
| 6,061,639 A | 5/2000 | Wistrand |
| 2005/0017685 A1* | 1/2005 | Rees ............... G01R 31/3679 320/132 |

* cited by examiner

*Primary Examiner* — Vuthe Siek
(74) *Attorney, Agent, or Firm* — Weaver Austin Villeneuve & Sampson LLP

(57) ABSTRACT

A system and technique for determining a state of charge (SOC) of a battery having at least two terminals and at least one silicon-based anode, or other anode materials exhibiting hysteretic voltage-SOC dependence such as tin-based anodes (whether partial or full dependence). The system and technique determines whether the battery is in a charge mode or a discharge mode of operation, measures a terminal voltage of the battery, and determines the SOC of the battery using (a) a first predetermined relationship between (i) the terminal voltage of the battery and (ii) the SOC of the battery when the battery is in a charge mode, and (b) a second predetermined relationship between (i) the terminal voltage of the battery and (ii) the SOC of the battery when the battery is in a discharge mode. In one embodiment, the terminal voltage is an equilibrium voltage of the battery.

25 Claims, 5 Drawing Sheets

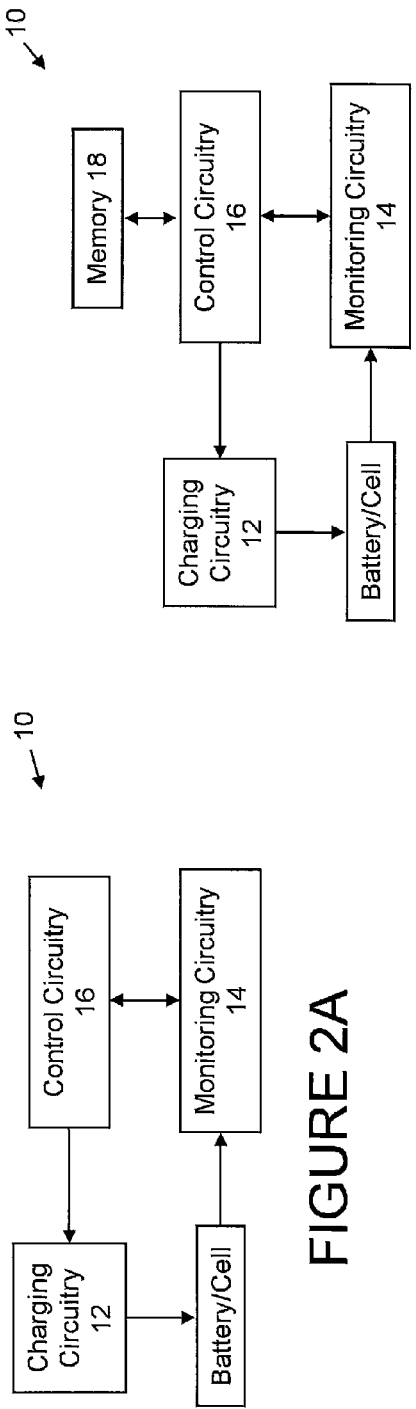
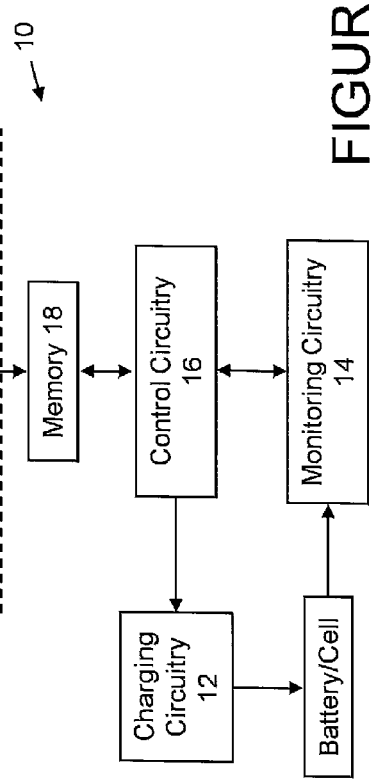
FIGURE 2A
FIGURE 2B
FIGURE 2C

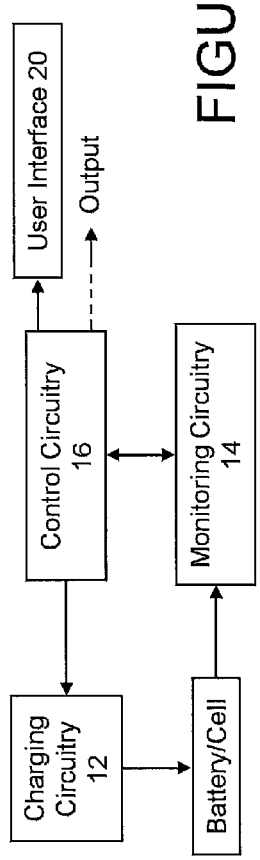
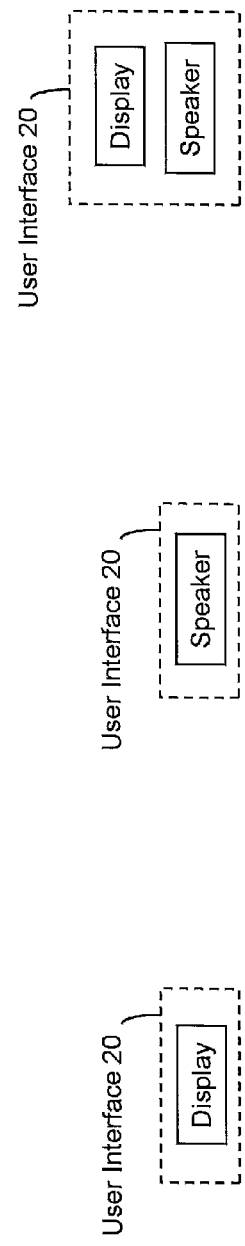
FIGURE 3
FIGURE 4A
FIGURE 4B
FIGURE 4C

CIRCUITRY AND TECHNIQUES FOR DETERMINING AN SOC OF A BATTERY/CELL HAVING A SILICON-BASED ANODE AND A FUEL GAUGE THEREFOR

RELATED APPLICATION

This non-provisional application claims priority to U.S. Provisional Application No. 61/772,891, entitled "Circuitry and Techniques for Determining a State of Charge a Battery/Cell having Silicon-based Anodes and a Fuel Gauge Therefor", filed Mar. 5, 2013 which is incorporated herein by reference in its entirety.

INTRODUCTION

The present inventions are directed to circuitry and techniques for estimating, calculating, measuring and/or determining the state of charge (SOC) of a battery/cell having a silicon-based anode (for example, a lithium-ion battery/cell). The SOC of a battery/cell, for example, a lithium-ion battery/cell having a silicon-based anode, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a zero reading indicates that the battery/cell is fully discharged. The data corresponding to the SOC of the battery/cell may be output, for example, visually or audibly, for example, to a user, and/or electronically, for example, to external circuitry as a "fuel gauge" to represent the available charge stored in or available from the battery/cell relative to a maximum available charge stored in the battery/cell.

Notably, the maximum available charge may change over an extended time as, for example, the battery/cell ages or deteriorates. The state of health (SOH) of a battery/cell (for example, a rechargeable lithium-ion (Li+) battery, is a parameter that describes, characterizes and/or is representative of the "age" of the battery/cell and/or ability of the battery/cell to hold/retain charge, for example, relative to a given time in operation (for example, relative to an initial time in operation—i.e., when the battery/cell is "new"). The SOH of a battery/cell provides information to estimate, calculate, measure and/or determine other battery/cell parameters, for example the SOC and the voltage of the battery. Indeed, the voltage at the terminals of the battery/cell (for a given SOC) may change as the SOH changes—and, hence the relationship between the measured voltage and SOC changes (for example, the voltage curves of the battery/cell shift) as the battery/cell ages and its SOH deteriorates.

In the discussion below, in connection with inventive circuitry and techniques for estimating, calculating, measuring and/or determining the SOC of a battery/cell having a silicon-based anode (for example, a lithium-ion battery/cell), there may be a dependence on temperature and further charging or recharging based on the temperature of the battery/cell. As such, although temperature may not be mentioned herein, the battery/cell parameters may change in accordance with temperature; moreover, the data and results may be dependent on the temperature of the battery/cell in addition to those parameters and considerations described and/or illustrated below.

BRIEF DESCRIPTION OF THE DRAWINGS

In the course of the detailed description to follow, reference will be made to the attached drawings. These drawings show different aspects of the present inventions and, where appropriate, reference numerals illustrating like structures, components, materials and/or elements in different figures are labeled similarly. It is understood that various combinations of the structures, components, and/or elements, other than those specifically shown, are contemplated and are within the scope of the present inventions.

Moreover, there are many inventions described and illustrated herein. The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein. Notably, an embodiment or implementation described herein as "exemplary" is not to be construed as preferred or advantageous, for example, over other embodiments or implementations; rather, it is intended reflect or indicate the embodiment or embodiments are "example" embodiment(s).

FIGS. 2A-2C illustrate block diagram representations of exemplary system to determine the SOC of a battery/cell, according to at least certain aspects of certain embodiments of the present inventions, wherein FIG. 2B includes discrete memory coupled to the control circuitry, and FIG. 2C illustrates circuitry external which accesses the memory to store one or more predetermined relationship between (i) the terminal voltage of the battery and (ii) the state of charge of the battery when the battery is in a charge mode of operation or in a discharge mode of operation;

FIG. 3 illustrates, in block diagram form, exemplary charging circuitry in conjunction with a battery/cell (which may include two terminals (for example, positive and negative terminals) and a user interface which provides information regarding the characteristics of the battery/cell and/or charging thereof (for example, the SOC of the battery/cell), according to at least certain aspects of certain embodiments of the present inventions, wherein in one embodiment, the charging circuitry may include voltage source and/or current source, and the monitoring circuitry may include voltage and/or current sensors (for example, a voltmeter and/or a current meter); and FIGS. 4A-4C illustrate, in block diagram form, exemplary user interfaces, which may include a display and/or a speaker wherein the display may be a conventional fuel gauge (for example, displayed figuratively (such as bars or tank fill) and/or numerically (for example, as a percentage)) depicting the amount of charge or an SOC of the battery/cell and the speaker provides audible information pertaining to the amount of charge or an SOC of the battery/cell.

Figure 1A:
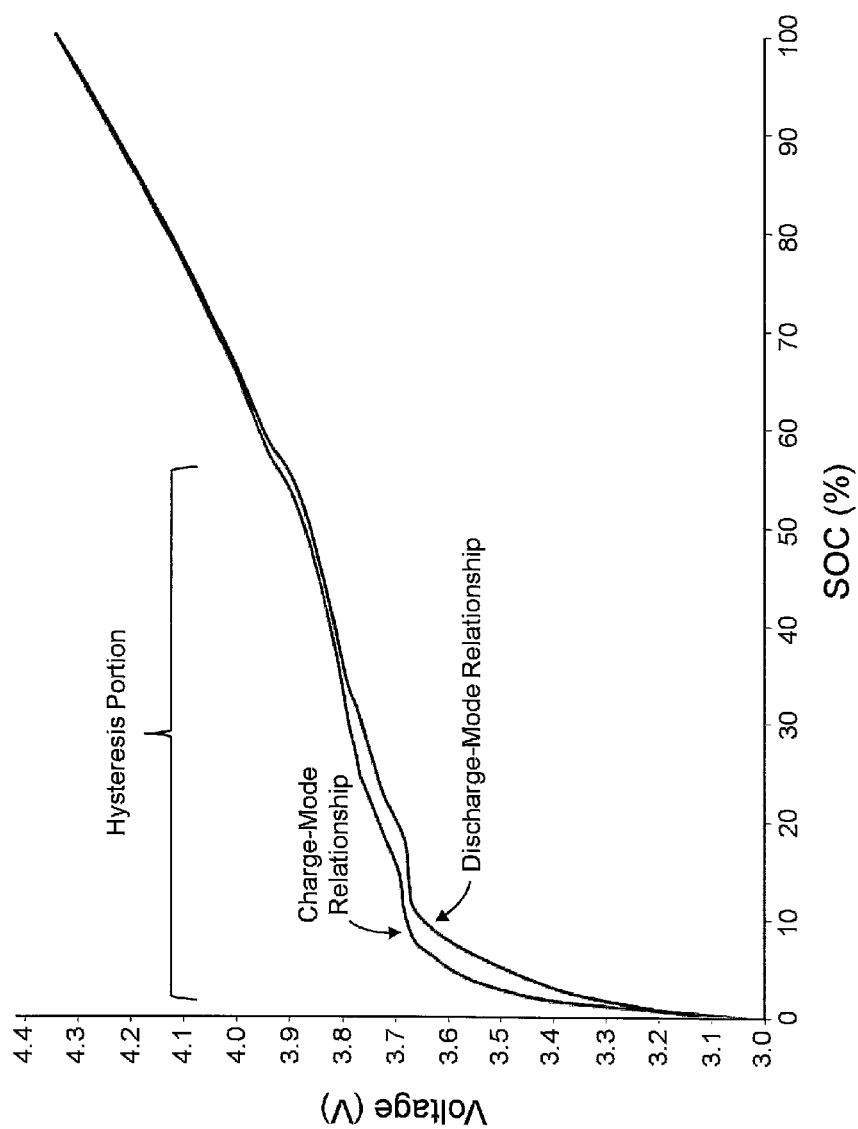
FIG. 1A illustrates an exemplary relationships of an equilibrium voltage of the battery/cell as a function of available stored charge in or the state of charge (SOC) of a lithium-ion battery having a silicon anode (for example, having a composite silicon oxide-graphite anode or composite silicon alloy-graphite anode), wherein the equilibrium voltage of a battery/cell is measured at the terminals of the battery/cell; notably, in the exemplary embodiment, the equilibrium voltage corresponds to a given SOC depending on whether the battery is in a charge-mode operation (i.e., applying charging to the battery (for example, which is generated by charging circuitry)) or discharge-mode of operation (i.e., removing charge from the battery (for example, by applying charge from the battery to a load))

Again, there are many inventions described and illustrated herein. The present inventions are neither limited to any single aspect nor embodiment thereof, nor to any combinations and/or permutations of such aspects and/or embodiments. Each of the aspects of the present inventions, and/or embodiments thereof, may be employed alone or in combination with one or more of the other aspects of the present inventions and/or embodiments thereof. For the sake of brevity, many of those combinations and permutations are not discussed separately herein.

Moreover, many other aspects, inventions and embodiments, which may be different from and/or similar to, the aspects, inventions and embodiments illustrated in the drawings, will be apparent from the description, illustrations and claims, which follow. In addition, although various features and attributes have been illustrated in the drawings and/or are apparent in light thereof, it should be understood that such features and attributes, and advantages thereof, are not required whether in one, some or all of the embodiments of the present inventions and, indeed, need not be present in any of the embodiments of the present inventions.

DETAILED DESCRIPTION

There are many inventions described and illustrated herein. In one aspect, the present inventions are directed to circuitry and techniques for estimating, calculating, measuring and/or determining the SOC of a battery/cell having a silicon-based anode, or other anode materials having or exhibiting hysteretic voltage-SOC dependence (for example, a lithium-ion battery/cell having, a composite silicon oxide-graphite anode or a composite silicon alloy-graphite anode, tin-based anode or a composite tin-graphite anode). The circuitry and techniques of the present inventions employ a voltage measured at the terminals of such a battery/cell to estimate, calculate, measure and/or determine an SOC of the battery/cell. In one embodiment, depending on whether the battery/cell is in a period of charging/recharging or a period of discharging, the circuitry and techniques employ a voltage measured at the terminals of the battery/cell (for example, a voltage which is and/or correlates to an equilibrium or overpotential voltage (hereinafter "equilibrium voltage") of the battery/cell) and a relationship between that voltage and an SOC of the battery/cell. That is, in one embodiment, the circuitry and techniques for determining the SOC of such a battery/cell employs, depending upon whether the battery/cell is in a charge or discharge mode of operation, one of a plurality of relationships between voltages measured at the terminals of the battery/cell (i.e., terminal voltages) and an SOC. For example, the circuitry and techniques, during a charging or recharging period (hereinafter collectively "charging period" or "period of charging") of the battery/cell, may employ a first relationship between a terminal voltage which is and/or correlates to an equilibrium voltage of the battery/cell and an SOC of the battery/cell. During a discharging period of the battery/cell, the circuitry and techniques may employ a second relationship between a terminal voltage which is and/or correlates to an equilibrium voltage of the battery/cell and an SOC of the battery/cell.

In one embodiment, the circuitry and techniques of the present inventions, depending on whether the battery/cell is in a period of charging or a period of discharging, employs a voltage which is and/or correlates to an equilibrium voltage of the battery/cell and a relationship between that voltage and an SOC of the battery/cell. Notably, an equilibrium voltage of the battery/cell may be characterized as a terminal voltage of the battery/cell which is substantially or relatively constant or unchanging under no charging current—which, for a conventional lithium ion battery/cell, is typically after a temporal duration of, for example, 1 to 1,000 seconds. The equilibrium voltage of the battery/cell may be estimated, calculated, measured and/or determined using any technique now known or later developed including those techniques described and/or illustrated in U.S. patent application Ser. No. 13/366,352, which is incorporated by reference herein. For example, the equilibrium voltage may be determined using two terminal voltages and based on or using the form, shape and/or rate of decay of the terminal voltage to a current pulse—(for example, in one embodiment, the predetermined percentage is preferably greater than 50% and, more preferably, between 60% and 95%). (See, for example, U.S. application Ser. No. 13/366,352).

With reference to FIG. 1A, in one exemplary embodiment, the circuitry and techniques of the present inventions, depending on whether the battery/cell is in a period of charging/recharging or a period of discharging, employ a voltage measured at the terminals of the battery/cell to estimate, calculate, measure and/or determine an SOC of the battery/cell. Here, when the battery/cell is in a period of charging/recharging, the circuitry and techniques may employ a measured voltage which is and/or correlates to an equilibrium voltage of the battery/cell and a charge-mode relationship between an equilibrium voltage (or the measured voltage which is and/or correlates to the equilibrium voltage) and an SOC of the battery/cell to estimate, calculate, measure and/or determine an SOC of the battery/cell. When, however, the battery/cell is in a period of discharging, the circuitry and techniques may employ a measured voltage which is or correlates to an equilibrium voltage of the battery/cell and a discharge-mode relationship between an equilibrium voltage and an SOC of the battery/cell to estimate, calculate, measure and/or determine an SOC of the battery/cell. As such, in this embodiment, the circuitry and techniques, when estimating, calculating, measuring and/or determining an SOC of the battery/cell using the aforementioned voltage-SOC relationship, employ the charge-mode relationship when the battery/cell is undergoing a charging operation and the discharge-mode relationship when the battery/cell is undergoing a discharging operation.

Notably, in certain embodiments, the battery/cell (having a silicon-based anode) may include only a partial "hysteresis" portion in the curves or relationships of a measured voltage and an SOC of the battery/cell whereby a portion of the measured voltage which is and/or correlates to an SOC of the battery during a period of charging and discharging include substantially different curves or relationships for a certain portion and substantially the same curves or relationships for another portion. As such, in one embodiment, the circuitry and techniques of the present inventions may employ the different voltage-SOC curves or relationships when the SOC of the battery/cell is in a "hysteresis" portion in the curves or relationships and, if not in the "hysteresis" portion in the curves or relationships, may employ the same voltage-SOC curve or relationship. For example, with reference to FIG. 1A, a "hysteresis" portion in the equilibrium voltage curves or relationships shown in the exemplary relationship is present from approximately 0% SOC to approximately 60% SOC (and is most prominent between approximately 2% to approximately 35%), at which point the charge and discharge equilibrium voltages essentially provide or collapse into a single relationship or onto a single curve whereby during a period of discharging and charging, the circuitry and techniques may employ a common relationship (between a measured voltage which is and/or correlates to an equilibrium voltage and an SOC of the battery/cell) to estimate, calculate, measure and/or determine an SOC of the battery/cell.

The hysteresis in the equilibrium voltage curves may be attributed to mechanical stress induced potentials in the silicon anode material and/or to other physical mechanisms within the battery/cell that are asymmetric in their physical and/or chemical properties. The SOC region at which the silicon becomes saturated with lithium and the charge and discharge equilibrium voltage (which may be determined via a measured voltage which is and/or correlates to the equilibrium voltage) provides or collapses into a common relationship or to a single curve may depend on the characteristics (for example, material composition) of the anode (for example, the ratio of silicon to graphite in the anode). Lithium insertion/de-insertion into silicon tends to occur at a different voltage than lithium insertion into graphite. As a result, the equilibrium voltage for the battery/cell at lower SOC (in this exemplary embodiment, less than 60%) may be more influenced by the charging of the silicon in the anode while the higher SOC region (again, in this embodiment, greater 60%) may be more influenced by the charging of the graphite in the anode. In one embodiment, the higher the silicon content, the higher the SOC at which the charge and discharge equilibrium voltages provide or collapse into a common relationship or to a single curve.

Figure 2D:
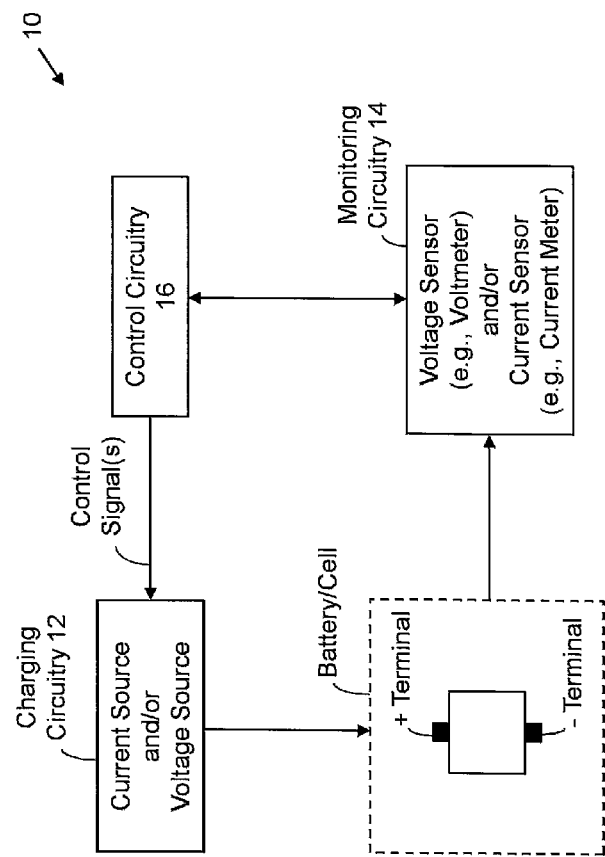
FIG. 2D illustrates, in block diagram form, exemplary system to determine the SOC of a battery/cell (which may include two terminals (for example, positive and negative terminals), according to at least certain aspects of certain embodiments of the present inventions, wherein in this exemplary embodiment, the charging circuitry may include voltage source and/or current source, and the monitoring circuitry may include voltage and/or current sensors (for example, a voltmeter and/or current meter)

The present inventions may employ any circuitry or system to implement the present inventions. For example, with reference to FIG. 2A, in one exemplary embodiment, circuitry 10 for a battery/cell includes charging circuitry 12, monitoring circuitry 14 and control circuitry 16 which implements one or more of the techniques described herein. Briefly, charging circuitry 12 applies current or charging signals to the battery/cell. The charging circuitry 12 may implement a constant-current, constant-voltage ("CCCV") charging technique, a step charging technique and/or a pulse current charging technique. Indeed, any charging technique now known or later developed may be employed, in conjunction with the present inventions, to charge the battery/cell; all such charging circuitry 12 are intended to fall within the scope of the present inventions. For example, charging circuitry 12 of the present inventions may generate charging and discharging signals, packets and pulses (incorporate by reference application). Notably, in certain embodiments, charging circuitry 12 is generally responsive to control signals from control circuitry 16.

With continued reference to FIG. 2A, monitoring circuitry 14 measures, monitors, senses, detects and/or samples, on an intermittent, continuous and/or periodic basis, condition or characteristics of the battery/cell including, for example, the voltage at the terminals of the battery/cell (i.e., the terminal voltage of the battery/cell). Notably, the circuitry and techniques of the present inventions may employ any monitoring circuitry 14 and/or measuring or monitoring techniques, whether described herein, now known or later developed, to acquire such data; all such monitoring circuitry 14 and measuring or monitoring techniques are intended to fall within the scope of the present inventions. The monitoring circuitry 14 provides data which is representative of the condition or characteristics of the battery/cell to control circuitry 16. Moreover, monitoring circuitry 14 may include one or more temperature sensors (not illustrated) which is/are thermally coupled to the battery/cell and/or charging circuitry to generate, measure and/or provide data which is representative of the temperature thereof.

The control circuitry 16, using data from monitoring circuitry 14, estimates, calculates, determines and/or assesses the SOC of the battery/cell and, may also estimate, calculate, determine and/or assesses the state or condition of the battery/cell in connection with the charging process. For example, control circuitry 16 calculates, determines and/or estimates a change in terminal voltage of the battery/cell in response to charge or current applied to or injected into the battery/cell. The control circuitry 16 may also calculate, determine and/or estimate one, some or all of the SOC of the battery/cell, SOH of the battery/cell, equilibrium voltage and/or overpotential or full relaxation time of the battery/cell.

In addition to estimating, calculating, determining and/or assessing the SOC of the battery/cell, control circuitry 16 may also calculate, determine and/or implement a charging sequence or profile based on or using one or more of the adaptive charging techniques and algorithms described herein (for example, those that are described and illustrated in the patent applications specified herein and incorporated by reference). In this regard, in one aspect of the present inventions, control circuitry 16 may adapt, adjust and/or control one or more characteristics of the charge or current applied to or injected into the battery/cell (via controlling the operation of charging circuitry 12) so that the change in terminal voltage of the battery/cell (in response to charge or current applied to or injected into the battery/cell during a charging or recharging sequence/operation) is within a predetermined range and/or below a predetermined value. In one embodiment, where charging circuitry 12 applies charge packets (having one or more charge pulses) to the battery/cell, control circuitry 16 (implementing, for example, one or more of the inventive adaptive charging techniques described herein) adapts, adjusts and/or controls the characteristics of the charge packets applied to or injected into the battery/cell (via controlling charging circuitry 12) so that the change in terminal voltage of the battery/cell in response to each charge packet is within a predetermined range and/or below a predetermined value. For example, control circuitry 16 may instruct charging circuitry 12 to change the characteristics of the charge or current applied to or injected into the battery/cell via controlling the amplitude/duration of the charge levels of a step charge sequence or shape, amplitude and/or width of charge pulse(s) of a pulse charge sequence.

In this way, control circuitry 16 may, in one embodiment, adapt, adjust and/or control the charge or current applied to or injected into the battery/cell (via controlling charging circuitry 12) so that the change in terminal voltage of the battery/cell in response to the charge or current is within a predetermined range and/or below a predetermined value.

Notably, control circuitry 16 may include one or more processors, one or more state machines, one or more gate arrays, programmable gate arrays and/or field programmable gate arrays, and/or a combination thereof. Indeed, control circuitry and monitoring circuitry may share circuitry with each other as well as with other elements; such circuitry may be distributed among a plurality of integrated circuits which may also perform one or more other operations, which may be separate and distinct from that described herein. Moreover, control circuitry 16 may perform or execute one or more applications, routines, programs and/or data structures that implement particular methods, techniques, tasks or operations described and illustrated herein. The functionality of the applications, routines or programs may be combined or distributed. In addition, the applications, routines or programs may be implementing by control circuitry 16 using any programming language whether now known or later developed, including, for example, assembly, FORTRAN, C, C++, and BASIC, whether compiled or uncompiled code; all of which fall within the scope of the present inventions.

In one embodiment, with reference to FIG. 1D, the monitoring circuitry monitors, senses, detects and/or samples (for example, on an intermittent, continuous and/or periodic basis), characteristics of the battery including, for example, the response of the battery/cell to one or more charge pulses and/or discharge pulses (including the terminal voltage of the battery/cell) and, in certain embodiments, the temperature of the battery/cell. The control circuitry acquires the data from the monitoring circuitry and, calculates, measures, determines and/or estimates the impedance of the battery/cell.

With continued reference to FIGS. 2A-2C, the circuitry and techniques of the present inventions may employ any monitoring circuitry 14 and monitoring techniques, whether that described herein, now known or later developed, to acquire data employed by the control circuitry to determine the SOC and/or SOH of the battery; all such monitoring circuitry and techniques are intended to fall within the scope of the present inventions. Similarly, the present inventions may employ any control circuitry and charging circuitry whether that described herein, now known or later developed, to charge the battery (or cells thereof) as well as determine the SOC and/or SOH of the battery.

As indicated herein, the monitoring circuitry monitors, senses, detects and/or samples (on an intermittent, continuous and/or periodic basis) characteristics of the battery/cell including, for example, voltages at the terminals of the battery/cell. In one embodiment, the monitoring circuitry includes a sensor to determine a voltage (for example, a voltmeter) and/or a sensor to determine a current (for example, a current meter). (See, for example, FIG. 2D). The monitoring circuitry and techniques may be those described herein, now known or later developed, to acquire data employed by the control circuitry to determine the SOC and/or SOH of the battery; all such monitoring circuitry and techniques are intended to fall within the scope of the present inventions.

Notably, in implementing the circuitry and techniques of the present inventions, it may be advantageous to generate specific or particular relationships (for the charge and/or discharge phase of operations) between the terminal voltage which is or correlates to an equilibrium voltage of the battery/cell and an SOC of the battery/cell in those instances where the anodes include different silicon contents. For example, when the silicon content in the anode differs in an amount that results in measurably or sufficiently different voltage—SOC relationship or curve (for the charge and/or discharge phase of operation of the battery/cell), it may be advantageous to generate particular charge and discharge equilibrium voltage—SOC relationships or curves for a battery/cell having differing anode characteristics (for example, the material composition of the anode—for example, the ratio of silicon to graphite in the anode of the battery/cell).

In one embodiment, the circuitry and techniques of the present inventions also employ an SOH of the battery/cell to change, compensate and/or alter the charge and/or discharge relationships between a terminal voltage which is or correlates to an equilibrium voltage of the battery/cell and an SOC of the battery/cell. For example, the characteristics of the hysteresis portion and/or the SOC of the battery/cell at which the charge and discharge equilibrium voltages collapse to a common relationship or curve will change over the lifetime of the battery/cell. This may be because the degradation that causes capacity loss in the silicon and graphite does not occur at the same rate for both materials, but the silicon may degrade faster than the graphite. Therefore, in one embodiment, the circuitry and techniques of the present inventions adjust, based on the SOH of the battery/cell, the correlations between the voltage which is or corresponds to an equilibrium voltage and the SOC of the battery/cell (for the charge and/or discharge phase of operations). In this way, as the SOH of the battery/cell changes (for example, ages, deteriorates or degrades), the relationship between the voltage measured at the terminals of the battery/cell (for example, the voltage which is and/or correlates to the equilibrium voltages measured during a charge or discharge operation) and the SOC of the battery/cell changes so that the circuitry and techniques of the present inventions may more accurately and adaptively estimate, calculate, measure and/or determine an SOC of the battery/cell.

The present inventions may employ any technique and/or circuitry now known or later developed may be employed to estimate, calculate, measure and/or determine SOH of a battery/cell and/or the impact of SOH on the relationships between a terminal voltage which is or correlates to an equilibrium voltage of the battery/cell and an SOC of the battery/cell. For example, with FIGS. 2A-2D, control or processing circuitry or external circuitry may calculate, determine and/or estimate the SOH of the battery/cell using the techniques and circuitry described and/or illustrated in, for example, PCT Application Serial No. PCT/US2012/30618, U.S. application Ser. No. 13/366,352 and/or U.S. application Ser. No. 13/657,841, all of which are incorporated herein by reference.

Notably, the relationship or curves for a battery/cell having a silicon-based anode (for example, a composite silicon oxide-graphite anode or a composite silicon alloy-graphite anode) may be determined using any technique now known or later developed. For example, the relationship or curves may be generated using a variety of slow or incremental charging techniques including, but not limited to, potentiostatic intermittent titration (PITT) or low current galvanostatic charging/discharging with rest periods that allow the battery/cell voltage to relax to its equilibrium value or voltage. Indeed, the present inventions may employ any initialization and/or characterization circuitry and techniques described and/or illustrated in PCT Application Serial No. PCT/US2012/30618, U.S. application Ser. No. 13/366,352 and/or U.S. application Ser. No. 13/657,841, which as mentioned above, is incorporated herein by reference The voltage-SOC relationships or curves (charging-mode and/or discharging mode) for a battery/cell having a silicon-based anode (for example, composite silicon oxide-graphite anode or composite silicon alloy-graphite anode) may, in addition to slow or incremental charging techniques, or in lieu thereof, be determined, based on or using empirical data, test data, simulation data, theoretical data and/or a mathematical relationship. For example, a charge-mode and/or discharge-mode relationship between a measured voltage which is and/or correlates to an equilibrium voltage and an SOC of the battery/cell to estimate, calculate, measure and/or determine an SOC of the battery/cell may, in addition to slow or incremental charging techniques, or in lieu thereof, be determined, based on or using empirical data, test data, simulation data, theoretical data and/or a mathematical relationship.

Based on empirical data, control/processing circuitry (or external circuitry) associated with a given battery/cell (for example, a certain series, manufacturing lot, chemistry and/or design) may determine, calculate and/or employ a predetermined correlation or relationship of the (i) measured voltage which is and/or correlates to an equilibrium voltage to (ii) the SOC of the battery/cell during charge-mode and/or discharge-mode. In another embodiment, based on or using initialization and/or characterization data, control/processing circuitry or circuitry external to the system may calculate or determine a relationship (charge-mode and/or discharging mode) of a measured voltage which is and/or correlates to an equilibrium voltage to the SOC of the battery/cell. In one embodiment, for example, based on or using (i) initialization and/or characterization data and/or (ii) empirical data, test data, simulation data, theoretical data and/or a mathematical relationship, control/processing circuitry (or external circuitry) may calculate, estimate or determine a relationship of a measured voltage which is and/or correlates to the equilibrium voltage (which may be acquired, for example, in response to a charge or discharge pulse) to the SOC for a particular or associated battery/cell. Indeed, in one embodiment, the control/processing circuitry may adjust the relationship of the voltage which is and/or correlates to an equilibrium voltage to the SOC over the life or use of the battery/cell—for example, based on the changing conditions of the battery/cell (for example, a measured SOH of the battery/cell).

Notably, the aforementioned curves or relationships may be stored in memory (for example, in a database or look-up table) during manufacture, test or calibration, and accessible to the circuitry and/or processes of the present inventions during operation. (See, for example, FIGS. 2B and 2C). The memory may be integrated or embedded in other circuitry (for example, control/processing circuitry associated with the battery/cell) and/or discrete. The memory may be of any kind or type (for example, EEPROM, Flash, MRAM, DRAM and/or SRAM). In addition, the SOH adjustments (for example, an adjustment factor and/or a plurality of databases or look-up tables based on SOH) may also be stored in memory.

As stated herein, the SOC of a rechargeable battery/cell, for example, a lithium-ion battery/cell having a composite silicon oxide-graphite anode or a composite silicon alloy-graphite anode, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a zero reading indicates that the battery/cell is fully discharged. The data corresponding to the SOC of the battery/cell may be output, for example, visually or audibly, for example, to a user, and/or electronically, for example, to external circuitry as a "fuel gauge" to represent the available charge stored in or available from the battery/cell relative to a maximum available charge stored in the battery/cell. Indeed, in another aspect, the present inventions are directed to circuitry and techniques for generating and displaying a gauge, indicator and/or information which is representative of an available energy capacity of the battery/cell using the SOC.

For example, where the present inventions are employed in portable electronics (for example, a mobile telephone, tablet or PDA), the system may employ operating system (OS), for example, Android or iOS, to acquire, determine and/or obtain data which is representative of the SOC (fuel gauge information) and thereafter display such data to, for example, the user via a display of the portable electronics. The present inventions may employ any techniques and/or circuitry, now known or later developed, to acquire, determine and/or obtain data which is representative of the SOC, including via communication interfaces such as MIPI, I2C and/or one-wire, and thereafter display such data to the user/operator.

Notably, in connection with generating data corresponding to the SOC of the battery/cell wherein the data is output, for example, visually or audibly to user interface 20 and/or to external circuitry, as a representation of the SOC of the battery/cell. (See, FIG. 3 and the exemplary "fuel gauge" embodiments of FIGS. 4A-4C). Notably, as indicated herein, SOC data may be characterized as information which is representative of the available charge stored in the battery/cell relative to a maximum available charge stored in the battery/cell—wherein the maximum available charge changes over time as, for example, the battery/cell ages or deteriorates. The SOC data may be output visually and/or audibly, for example, to a user (for example, via user interface 20), and/or electronically, for example, to external circuitry. (See, FIGS. 3 and 4A-4C).

In another embodiment, the circuitry and techniques of the present inventions, in response to determining the battery/cell experienced or is subjected to a partial charge cycle or partial discharge cycle followed by the other cycle (for example, a partial charge cycle followed by a partial discharge cycle) during, for example, a hysteresis portion, may determine the SOC using an intermediate pathway relationship. For example, with reference to FIG. 1B, when a battery/cell (having a silicon-based anode) is subjected to a partial charge cycle followed by a discharge, the equilibrium voltage of the battery/cell (or the measured voltage which is and/or correlates to the equilibrium voltage) may not immediately correspond to an SOC of the discharge-mode relationship when the battery/cell is in a hysteresis portion (see also, FIG. 1A). In this embodiment, the circuitry and techniques of the present inventions (for example, the control circuitry, in conjunction with the monitoring circuitry) may monitor the discharge characteristics (for example, rate and time) to determine whether the measured voltage which is and/or correlates to an equilibrium voltage of the battery/cell corresponds to the discharge-mode relationship and the SOC thereof. Notably, the present inventions may employ any circuit or technique to monitor the discharge characteristics of the battery/cell including, for example, Coulomb counting technique/circuit to determine the extent of the charge and/or discharge.

Figure 1B:
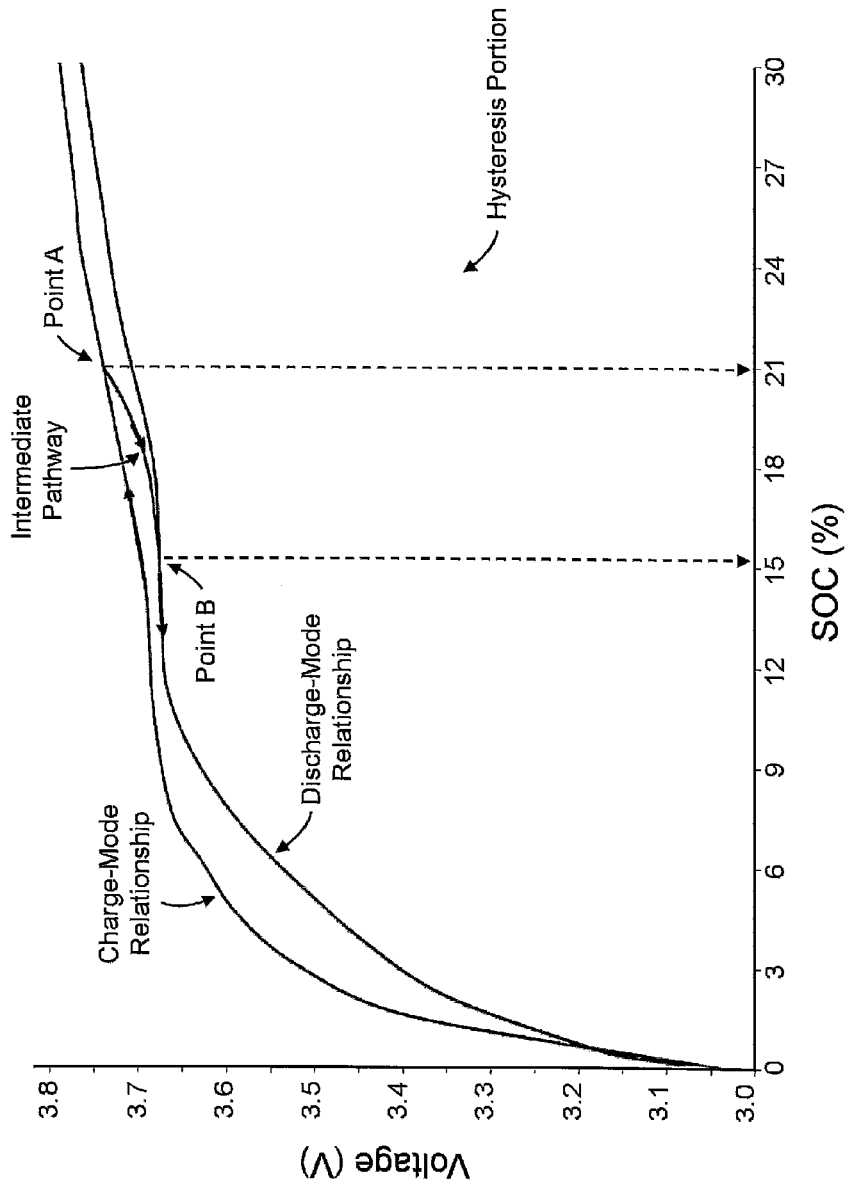
FIG. 1B illustrates additional exemplary relationships of an equilibrium voltage of the battery/cell as a function of available stored charge in or the state of charge (SOC) of a lithium-ion battery having a silicon anode (for example, having a composite silicon oxide-graphite anode or composite silicon alloy-graphite anode), wherein a partial charge cycle is followed by a discharge demonstrating an intermediate pathway of the equilibrium voltage between the charge-mode curve/relationship (due to a charge-mode operation or applying charge into the battery) and discharge-mode curve/relationship (due to discharge-mode operation or removing charge from the battery)

With continued reference FIG. 1B, if the battery/cell is charged from 0% SOC up to Point A, an equilibrium voltage of the battery/cell (or the measured voltage which is and/or correlates to the equilibrium voltage) corresponds to the SOC indicated via the charge-mode relationship. If the battery/cell is switched to discharge mode of operation at Point A, a measured voltage which is and/or correlates to an equilibrium voltage of the battery/cell does not immediately correspond to an SOC of the battery/cell on the discharge-mode relationship. Rather, the equilibrium voltage-SOC relationship may take or follow an Intermediate Pathway between the charge-mode curve or relationship and discharge-mode curve or relationship (see "intermediate pathway" between Point A and Point B). After discharge for a period of time, the equilibrium voltage-SOC relationship follows the discharge-mode curve as represented by the intersection of the Intermediate Pathway and the discharge-mode curve or relationship at Point B. At that point, if battery/cell remains in the discharge mode of operation, a measured voltage which is and/or correlates to an equilibrium voltage of the battery/cell corresponds to an SOC on the discharge-mode curve or relationship (i.e., in this exemplary embodiment, between Point B and 0% SOC). However, if battery/cell is switched back to charge-mode, the relationship between the equilibrium voltage and SOC will follow another intermediate pathway from the discharge-mode curve back to the charge-mode curve. The control circuitry, in conjunction with the monitoring circuitry and/or charging circuitry, may determine whether the battery/cell is in a discharge mode of operation or a charge mode of operation.

Notably, the circuitry and techniques of the present inventions may employ galvanostatic charge/discharge circuits/techniques similar to those used to generate the charge and discharge equilibrium voltage curves to determine, estimate and/or calculate the relationship of the intermediate pathway—that is, to determine, estimate and/or calculate the amounts of continuous discharging (charging) following a partial charge (discharge) before an equilibrium voltage corresponds to the discharge (charge) equilibrium voltage curve. In addition thereto, or in lieu thereof, the relationship of the intermediate pathway may be determined, based on or using empirical data, test data, simulation data, theoretical data and/or a mathematical relationship.

The curves or relationships of the intermediate pathway may also be stored in memory (for example, in a database or look-up table) during manufacture, test or calibration, and accessible to the circuitry and/or processes of the present inventions during operation. (See, for example, FIGS. 2B and 2C). As mentioned above, the memory may be integrated or embedded in other circuitry (for example, control/processing circuitry associated with the battery/cell) and/or discrete and may be of any kind or type (for example, EEPROM, Flash, MRAM, DRAM and/or SRAM). (See, for example, FIGS. 2A-2D).

Further, present inventions may employ Coulomb counting in connection with a fuel gauge to determine whether the battery/cell has been discharging (charging) for a sufficient period following a partial charge (discharge) for a measured voltage which is and/or correlates to an equilibrium voltage measurement to correspond to the discharge (charge) curve or relationship. Here, the present inventions may employ any Coulomb counting circuit or technique technique/circuit to determine the extent of the charge and/or discharge.

There are many inventions described and illustrated herein. While certain embodiments, features, attributes and advantages of the inventions have been described and illustrated, it should be understood that many others, as well as different and/or similar embodiments, features, attributes and advantages of the present inventions, are apparent from the description and illustrations. As such, the embodiments, features, attributes and advantages of the inventions described and illustrated herein are not exhaustive and it should be understood that such other, similar, as well as different, embodiments, features, attributes and advantages of the present inventions are within the scope of the present inventions.

Indeed, the present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof.

For example, fuel gauging of lithium-ion cells having silicon-based anodes may implement, depending on whether the battery/cell is in a charge mode or discharge mode of operation, different relationships between a measured voltage which is or correlates to an equilibrium voltage and an SOC. These relationships of curves may be correlated to the silicon content of the anode as well as to the SOH of the battery/cell (for example, the SOH of the anode and/or cathode). Additionally, the present inventions may also employ Coulomb counting when the battery/cell undergoes partial charge/discharge cycles to determine whether a reliable SOC determination may be made in view of a measured voltage which is or correlates to an equilibrium voltage. Here, Coulomb counting may be used to determine if the battery/cell has been charging/discharging for a sufficient period that the equilibrium voltage of the battery/cell (or voltage which correlates to the equilibrium voltage) corresponds to the charge/discharge curve rather than to a voltage on an intermediate segment between the charge/discharge curves or relationships (see "Intermediate Pathway" in FIG. 1B).

Although much of the disclosure herein has been set forth in the context of a voltage that is or correlates to an equilibrium voltage of the battery/cell, the inventions and techniques are also applicable to other voltage based parameters—for example, using data which is representative of a charge pulse voltage (CPV) or a change in the CPV. The CPV may be characterized as (i) a peak voltage, measured at the terminals of the battery/cell, which is in response to a charge pulse and/or (ii) a substantial peak voltage (i.e., within 5-10% of the peak voltage), measured at the terminals of the battery/cell, which is in response to a charge pulse. (See, for example, U.S. application Ser. No. 13/626,605, "Method and Circuitry to Adaptively Charge a Battery/Cell", filed on Sep. 25, 2012). For the sake of brevity, the discussions above, in connection with a CPV or a change in the CPV, will not be repeated for those instances/embodiments where data which is representative of a charge pulse voltage (CPV) or a change in the CPV is employed to estimate, calculate, measure and/or determine the SOC of the battery/cell using a relationship between that voltage and an SOC of the battery/cell; however, it is intended that embodiments employing the CPV (or change therein)—SOC relationship to estimate, calculate, measure and/or determine the SOC of the battery/cell fall within the scope of the present inventions.

As noted above, the SOC of a battery/cell, for example, a lithium-ion rechargeable battery/cell, is a parameter that is representative of and/or indicates the level of electrical charge available in the battery/cell. It may be characterized as a percentage of the nominal full charge rating of the battery/cell, wherein a 100% SOC indicates that a battery/cell is fully charged and a zero reading indicates that the battery/cell is fully discharged. The SOC of the battery/cell may also be characterized as an available charge stored in the battery/cell relative to a maximum available charge stored in the battery/cell—wherein the maximum available charge may change over time as, for example, the battery/cell ages or deteriorates.

It should be further noted that the circuitry of the present inventions may include and/or employ the control/processing circuitry, monitoring circuitry and/or charging circuitry described and illustrated in PCT Application Serial No. PCT/US2012/30618, U.S. application Ser. No. 13/366,352, U.S. application Ser. No. 13/626,605, U.S. application Ser. No. 13/657,841, U.S. application Ser. No. 13/747,914, all of which are incorporated herein by reference. For the sake of brevity, the discussion regarding such circuitry, in the context of the techniques of the present inventions, will not be repeated.

Notably, "circuitry", means, among other things, a circuit (whether integrated or otherwise), a group of such circuits, one or more processors, one or more state machines, one or more processors implementing software, one or more gate arrays, programmable gate arrays and/or field programmable gate arrays, or a combination of one or more circuits (whether integrated or otherwise), one or more state machines, one or more processors, one or more processors implementing software, one or more gate arrays, programmable gate arrays and/or field programmable gate arrays. The term "data" means, among other things, a current or voltage signal(s) (plural or singular) whether in an analog or a digital form, which may be a single bit (or the like) or multiple bits (or the like).

Further, control/processing circuitry (employed to implement the operations and/or techniques described herein) may perform or execute one or more applications, routines, programs and/or data structures that implement particular methods, techniques, tasks or operations described and illustrated herein. The functionality of the applications, routines or programs may be combined or distributed. In addition, the applications, routines or programs may be implemented by the control circuitry using any programming language whether now known or later developed, including, for example, assembly, FORTRAN, C, C++, and BASIC, whether compiled or uncompiled code; all of which are intended to fall within the scope of the present inventions.

Moreover, monitoring circuitry and control/processing circuitry (which is employed to implement the operations and/or techniques described herein) may share circuitry with each other as well as with other elements. Moreover, such circuitry may be distributed among a plurality of integrated circuits which may also perform one or more other operations, which may be separate and distinct from that described herein.

The memory which stores the data, equations, relationships, and/or look up table may be a permanent, semi-permanent or temporary (i.e., until re-programmed) storage that is discrete or resident on (i.e., integrated in), for example, the control circuitry. As such, in one embodiment, the memory may be one time programmable, or data, equations, relationships, and/or look up table employed by the control/processing circuitry may be one time programmable (for example, programmed during test or at manufacture). In another embodiment, the memory is more than one time programmable and, as such, the predetermined values and/or band limits employed by the control circuitry may be modified after test and/or manufacture.

Many modifications, variations, combinations and/or permutations are possible in light of the above teaching. For example, although the exemplary embodiments and/or techniques are described and/or illustrated in the context of circuitry for and techniques for a lithium ion technology/chemistry based battery/cell (for example, lithium-cobalt dioxide, lithium-manganese dioxide, lithium-iron phosphate, and lithium-iron disulfide) having silicon oxide-graphite anode or silicon alloy-graphite anode, the inventions described and/or illustrated herein may also be implemented in conjunction with other electrolyte battery/cell chemistries/technologies having anode(s) comprised of "pure" silicon or silicon and one more other materials including, for example, other silicon-carbon composite materials. As such, the discussions in the context of lithium ion based batteries/cells having silicon oxide-graphite or silicon alloy-graphite anodes are merely exemplary; and other electrolyte, battery/cell chemistries or technologies and other silicon-based anodes, implementing one or more of the features of the present inventions as described herein, are intended to fall within the scope of the present inventions. Thus, it is to be understood that other embodiments may be utilized and operational changes may be made without departing from the scope of the present inventions. As such, the foregoing description of the exemplary embodiments of the inventions has been presented for the purposes of illustration and description. It is intended that the scope of the inventions not be limited solely to the description above.

Although much of the disclosure herein has been set forth in the context of a silicon-based anode, as intimated above, the present inventions are also applicable to other anode materials having or exhibiting hysteretic voltage-SOC dependence such as, for example, an anode including one or more tin alloys or a composite tin-graphite anode. For the sake of brevity, the aforementioned discussions will not be repeated in the context of such other anode materials with hysteretic voltage-SOC dependence, for example, tin alloy-based anodes.

In addition, the present inventions are also applicable to a battery/cell having a composite cathode material which exhibits an hysteretic voltage-SOC dependence. That is, although the discussion above is in the context of a battery/cell having a silicon-based anode, the embodiments and/or the present inventions are applicable to a battery/cell having a composite material cathode (whether or not such battery/cell also includes a silicon-based anode material). For the sake of brevity such discussions will not be repeated in the context of silicon-based anode material—however, it should be understood that the embodiments for estimating, calculating, measuring and/or determining the SOC of a battery/cell having silicon-based anodes, as described herein, may be employed in conjunction with a battery/cell having a composite material cathode and, as such, a battery/cell having a composite material cathode (whether or not such battery/cell also includes a silicon-based anode material) is intended to fall within the scope of the present inventions. Again, for the sake of brevity a discussion of such embodiments will not be repeated in those instances where the battery/cell includes a composite material cathode.

It should be further noted that the various circuits and circuitry disclosed herein may be described using computer aided design tools and expressed (or represented), as data and/or instructions embodied in various computer-readable media, in terms of their behavioral, register transfer, logic component, transistor, layout geometries, and/or other characteristics. Formats of files and other objects in which such circuit expressions may be implemented include, but are not limited to, formats supporting behavioral languages such as C, Verilog, and HLDL, formats supporting register level description languages like RTL, and formats supporting geometry description languages such as GDSII, GDSIII, GDSIV, CIF, MEBES and any other formats and/or languages now known or later developed. Computer-readable media in which such formatted data and/or instructions may be embodied include, but are not limited to, non-volatile storage media in various forms (e.g., optical, magnetic or semiconductor storage media) and carrier waves that may be used to transfer such formatted data and/or instructions through wireless, optical, or wired signaling media or any combination thereof. Examples of transfers of such formatted data and/or instructions by carrier waves include, but are not limited to, transfers (uploads, downloads, e-mail, etc.) over the Internet and/or other computer networks via one or more data transfer protocols (e.g., HTTP, FTP, SMTP, etc.).

Indeed, when received within a computer system via one or more computer-readable media, such data and/or instruction-based expressions of the above described circuits may be processed by a processing entity (e.g., one or more processors) within the computer system in conjunction with execution of one or more other computer programs including, without limitation, net-list generation programs, place and route programs and the like, to generate a representation or image of a physical manifestation of such circuits. Such representation or image may thereafter be used in device fabrication, for example, by enabling generation of one or more masks that are used to form various components of the circuits in a device fabrication process.

Moreover, the various circuits and circuitry, as well as techniques, disclosed herein may be represented via simulations using computer aided design and/or testing tools. The simulation of the charging circuitry, control circuitry and/or monitoring circuitry, and/or techniques implemented thereby, may be implemented by a computer system wherein characteristics and operations of such circuitry, and techniques implemented thereby, are imitated, replicated and/or predicted via a computer system. The present inventions are also directed to such simulations of the inventive charging circuitry, control circuitry and/or monitoring circuitry, and/or techniques implemented thereby, and, as such, are intended to fall within the scope of the present inventions. The computer-readable media corresponding to such simulations and/or testing tools are also intended to fall within the scope of the present inventions.

Notably, reference herein to "one embodiment" or "an embodiment" means that a particular feature, structure, or characteristic described in connection with the embodiment can be included in one some or all of the embodiments of the present inventions. The usages or appearances of the phrase "in one embodiment" or "in another embodiment" in the specification are not referring to the same embodiment, nor are separate or alternative embodiments necessarily mutually exclusive of one or more other embodiments. The same applies to the term "implementation." The present inventions are neither limited to any single aspect nor embodiment thereof, nor to any combinations and/or permutations of such aspects and/or embodiments. Moreover, each of the aspects of the present inventions, and/or embodiments thereof, may be employed alone or in combination with one or more of the other aspects of the present inventions and/or embodiments thereof. For the sake of brevity, certain permutations and combinations are not discussed and/or illustrated separately herein.

Further, an embodiment or implementation described herein as exemplary is not to be construed as preferred or advantageous, for example, over other embodiments or implementations; rather, it is intended convey or indicate the embodiment or embodiments are example embodiment(s).

In the claims, the term "determine" and "calculate" and other forms thereof (i.e., determining, determined and the like or calculating, calculated and the like) means, among other things, calculate, assesses, determine and/or estimate and other forms thereof. Further, the term "battery" means an individual cell (which stores energy) and/or a plurality of cells arranged electrically in a series and/or parallel configuration.

Moreover, the phrase "determining a state of charge of the battery" and "calculating a state of charge of the battery" in the claims means determining, detecting, calculating, estimating, and/or measuring a state of charge of the battery and/or a change in a state of charge of the battery/cell. Similarly, the phrase "calculating a state of health of the battery" and "determining a state of health of the battery" in the claims means determining, detecting, calculating, estimating, and/or measuring a state of health of the battery and/or a change in a state of health of the battery/cell.

In addition, the terms "first," "second," and the like, herein do not denote any order, quantity, or importance, but rather are used to distinguish one element from another. Moreover, the terms "a" and "an" herein do not denote a limitation of quantity, but rather denote the presence of at least one of the referenced item. Further, the term "data" may mean, among other things, a current or voltage signal(s) whether in analog or a digital form (which may be a single bit (or the like) or multiple bits (or the like)).

As used in the claims, the terms "comprises," "comprising," "includes," "including," "have," and "having" or any other variation thereof, are intended to cover a non-exclusive inclusion, such that a process, method, article, or apparatus that comprises a list of elements does not include only those elements but may include other elements not expressly listed or inherent to such process, method, article, or apparatus.

Further, the statement that one or more circuits, circuitry, nodes and/or components are "coupled" means that the circuits, circuitry, nodes and/or components are joined and/or operate (for example, physically or electrically) together either directly or indirectly, i.e., through one or more intermediate circuits, circuitry, nodes and/or components, so long as a link occurs; "directly coupled" means that two elements are directly joined, in contact and/or operate with each other.

What is claimed is:

1. A method to determine a state of charge of a battery using monitoring circuitry and control circuitry, wherein the battery includes at least two terminals and an anode that exhibits hysteretic voltage-state of charge dependence, the method comprising:

determining whether the battery is in a charge mode of operation or a discharge mode of operation;

measuring, with the monitoring circuitry, a terminal voltage of the battery, wherein the terminal voltage is a voltage measured between two terminals of the battery, wherein one of the two terminals is connected to the anode and the other of the two terminals is connected to a cathode of the battery;

selecting, using the control circuitry, a predetermined relationship between (i) the terminal voltage of the battery and (ii) the state of charge of the battery from a plurality of relationships comprising:
  a first predetermined relationship between (i) the terminal voltage of the battery and (ii) the state of charge of the battery when the battery is in a charge mode of operation, and
  a second predetermined relationship between (i) the terminal voltage of the battery and (ii) the state of charge of the battery when the battery is in a discharge mode of operation, wherein the first and second predetermined relationships have different paths corresponding to the hysteretic voltage-state of charge dependence; and
determining, using the control circuitry, the state of charge of the battery using the terminal voltage and the selected relationship.

2. The method of claim 1 wherein the terminal voltage is a voltage which is constant or substantially constant after applying a pulse and before applying an immediately subsequent pulse.

3. The method of claim 1 further including determining an equilibrium voltage of the battery using the terminal voltage.

4. The method of claim 3 further including applying a pulse to the terminals of the battery, wherein the equilibrium voltage of the battery is determined based on or using the form, shape and/or rate of decay of the voltage between two terminals of the battery due to the pulse and wherein the pulse is a charge pulse or a discharge pulse.

5. The method of claim 1 further including:
changing at least one of the plurality of predetermined relationships between (i) the terminal voltage of the battery and (ii) the state of charge of the battery in accordance with a state of health of the battery.

6. The method of claim 5 further including:
determining an equilibrium voltage of the battery using (i) the terminal voltage and (ii) characteristics of a form, shape and/or rate of decay of a voltage between the terminals which is associated with the battery.

7. The method of claim 1, further comprising measuring the temperature of the battery and wherein the predetermined relationship between the (i) the terminal voltage of the battery and (ii) the state of charge of the battery has a temperature dependence.

8. The method of claim 1, wherein the anode is a silicon-based anode.

9. The method of claim 1, wherein the terminal voltage is measured during charging or discharging.

10. A method to determine a state of charge of a battery using monitoring circuitry and control circuitry, wherein the battery includes at least two terminals and an anode that exhibits a hysteretic voltage-state of charge dependence, the method comprising:
determining whether the battery is in a charge mode of operation, a discharge mode of operation, or has undergone a change in mode of operation and is on an intermediate pathway of terminal voltage versus state of charge;
measuring a terminal voltage of the battery, with monitoring circuitry, wherein the terminal voltage is a voltage measured between two terminals of the battery, wherein one of the two terminals is connected to the anode and the other of the two terminals is connected to a cathode of the battery;
selecting, using control circuitry, a predetermined relationship between (i) the terminal voltage of the battery and (ii) the state of charge of the battery from a plurality of relationships including:
  a first predetermined relationship between (i) the terminal voltage of the battery and (ii) the state of charge of the battery when the battery is in a charge mode of operation,
  a second predetermined relationship between (i) the terminal voltage of the battery and (ii) the state of charge of the battery when the battery is in a discharge mode of operation, and
  a third predetermined relationship between (i) the terminal voltage of the battery and (ii) the state of charge of the battery when the battery has undergone a change in mode of operation and is on an intermediate pathway of voltage versus state of charge, wherein the first, second, and third predetermined relationships have different paths corresponding to the hysteretic voltage-state of charge dependence; and
determining the state of charge of the battery using the terminal voltage and the selected relationship.

11. The method of claim 10 wherein the terminal voltage is a voltage which is constant or substantially constant after applying a pulse and before applying an immediately subsequent pulse.

12. The method of claim 10 further including:
changing at least one of the plurality of predetermined relationships between (i) the terminal voltage of the battery and (ii) the state of charge of the battery in accordance with a state of health of the battery.

13. The method of claim 10 further including determining an equilibrium voltage of the battery using the terminal voltage.

14. The method of claim 13 further including applying a pulse to the terminals of the battery, wherein the equilibrium voltage of the battery is determined based on or using the form, shape and/or rate of decay of the voltage between two terminals of the battery due to the pulse and wherein the pulse is a charge pulse or a discharge pulse.

15. The method of claim 10, further comprising measuring the temperature of the battery and selecting a predetermined relationship between the (i) the terminal voltage of the battery and (ii) the state of charge of the battery wherein the relationship has temperature dependence.

16. The method of claim 10, wherein selecting the predetermined relationship between (i) the terminal voltage of the battery and (ii) the state of charge of the battery in the intermediate pathway comprises counting charge passing after the battery undergoes the change in mode of operation.

17. The method of claim 10, wherein and the anode is a silicon-based anode.

18. The method of claim 10, wherein the terminal voltage is measured during charging or discharging.

19. An apparatus to determine the state of charge a battery, wherein the battery includes at least two terminals and an anode that exhibits hysteretic voltage-state of charge dependence, the apparatus comprising:
charge circuitry, coupled to the battery, to generate a charge signal and apply the charge signal to the at least two terminals of the battery;
monitoring circuitry, coupled to the battery, to measure a first voltage between two terminals of the battery, wherein one of the two terminals is connected to the anode and the other of the two terminals is connected to a cathode of the battery; and
control circuitry which is coupled to the measurement circuitry and charge circuitry, wherein the control circuitry is configured to:

determine whether the battery is in a charge mode of operation, a discharge mode of operation, or has undergone a change in mode of operation and is on an intermediate pathway of terminal voltage versus state of charge;

select a predetermined relationship between (i) the first voltage and (ii) the state of charge of the battery from a plurality of relationships comprising:

a first predetermined relationship between (i) the first voltage and (ii) the state of charge of the battery when the battery is in a charge mode of operation, a second predetermined relationship between (i) the first voltage and (ii) the state of charge of the battery when the battery is in a discharge mode of operation, and a third predetermined relationship between (i) the first voltage and (ii) the state of charge of the battery when the battery has undergone a change in mode of operation and is on an intermediate pathway of voltage versus state of charge, wherein the first, second, and third predetermined relationships have different paths corresponding to the hysteretic voltage-state of charge dependence; and determine the state of charge of the battery using the first voltage and the selected relationship.

20. The apparatus of claim 19 wherein the first voltage of the battery correlates to an equilibrium voltage of the battery.

21. The apparatus of claim 19 wherein the charge circuitry includes applying a pulse to the two terminals of the battery, wherein the terminal voltage is a voltage from which an equilibrium voltage of the battery is capable of being determined based on or using the form, shape and/or rate of decay of the voltage at the two terminals of the battery due to the pulse and wherein the pulse is a charge pulse or a discharge pulse.

22. The apparatus of claim 19 wherein the control circuitry is further configured to change at least one of a plurality of predetermined relationships between (i) the terminal voltage of the battery and (ii) the state of charge of the battery in accordance with a state of health of the battery.

23. The apparatus of claim 22 wherein the charge circuitry includes applying a pulse to the two terminals of the battery, wherein the terminal voltage is a voltage from which an equilibrium voltage of the battery is capable of being determined based on or using the form, shape and/or rate of decay of the voltage at the two terminals of the battery due to the pulse and wherein the pulse is a charge pulse or a discharge pulse.

24. The apparatus of claim 22 wherein the control circuitry is further configured to calculate the state of health of the battery.

25. The apparatus of claim 19, wherein the monitoring circuitry is configured to measure the first voltage during charging or discharging.

* * * * *